United States Patent
Mody

(10) Patent No.: US 10,326,629 B2
(45) Date of Patent: Jun. 18, 2019

(54) SYSTEM AND METHOD FOR ENCODING AND DECODING DATA

(71) Applicant: Sasken Technologies Ltd, Bangalore (IN)

(72) Inventor: Naman Rajiv Mody, Bangalore (IN)

(73) Assignee: SASKEN TECHNOLOGIES LTD, Bengaluru, KA (IN)

( * ) Notice: Subject to any disclaimer, the term of this patent is extended or adjusted under 35 U.S.C. 154(b) by 70 days.

(21) Appl. No.: 15/783,198

(22) Filed: Oct. 13, 2017

(65) Prior Publication Data

US 2018/0337812 A1 Nov. 22, 2018

(30) Foreign Application Priority Data

May 19, 2017 (IN) .............................. 201741017628

(51) Int. Cl.
| | | |
|---|---|---|
| *H04L 27/34* | (2006.01) | |
| *H04L 27/26* | (2006.01) | |
| *H04L 27/04* | (2006.01) | |
| *H03M 13/00* | (2006.01) | |
| *H03M 13/01* | (2006.01) | |
| *H04L 27/20* | (2006.01) | |

(52) U.S. Cl.
CPC ...... *H04L 27/2627* (2013.01); *H03M 13/015* (2013.01); *H03M 13/611* (2013.01); *H04L 27/04* (2013.01); *H04L 27/20* (2013.01); *H04L 27/3433* (2013.01); *H04L 27/3488* (2013.01)

(58) Field of Classification Search
CPC ..... H04L 27/2627; H04L 27/04; H04L 27/20; H03M 13/611; H03M 13/015
See application file for complete search history.

(56) References Cited

U.S. PATENT DOCUMENTS

| | | | | |
|---|---|---|---|---|
| 2004/0114450 A1* | 6/2004 | Kang | ....................... | H04L 27/36 365/230.03 |
| 2015/0117866 A1* | 4/2015 | Chien | .................. | H04L 27/3483 398/140 |
| 2017/0069333 A1* | 3/2017 | Mamola | ................ | G10L 19/167 |

* cited by examiner

*Primary Examiner* — Dac V Ha

(57) ABSTRACT

A method for encoding K bits of data, wherein K is a multiple of N is provided. The method includes a first step of mapping N consecutive bits of the K bits of data, starting from either its least significant bit or its most significant bit, to a point within a quadrant out of $2^N$ quadrants of an N-dimensional space. The method includes a second step of mapping the subsequent contiguous N consecutive bits of the K bits of data, to a point within a sub-quadrant out of $2^N$ quadrants of the N dimensional space within the previous quadrant. The method includes repeating the second step until all K bits of data have been mapped. The method includes a third step of obtaining N coordinate values of N consecutive bits of the data mapped last, wherein the N coordinate values represent the encoded code word for the K bits of data.

20 Claims, 13 Drawing Sheets

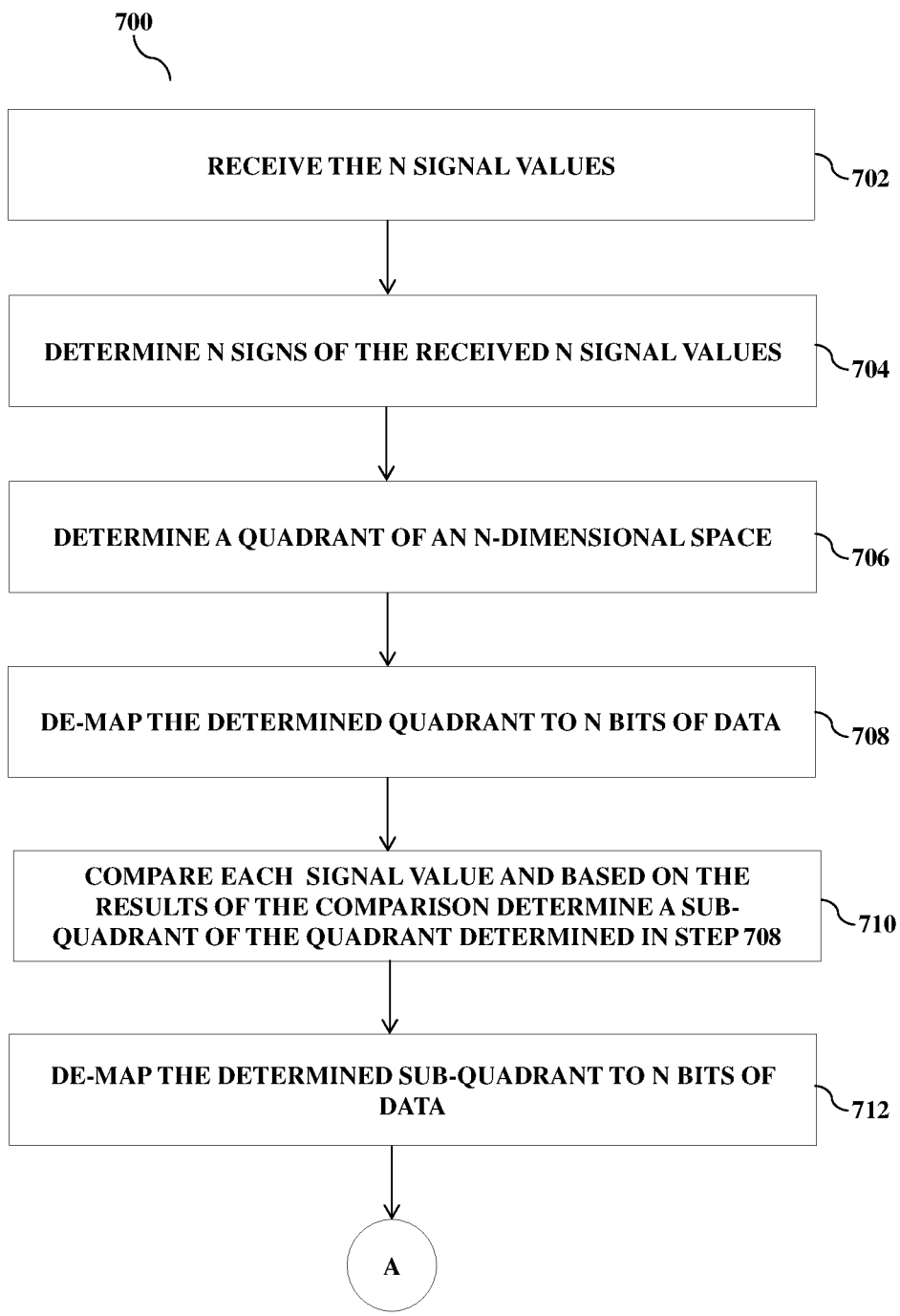

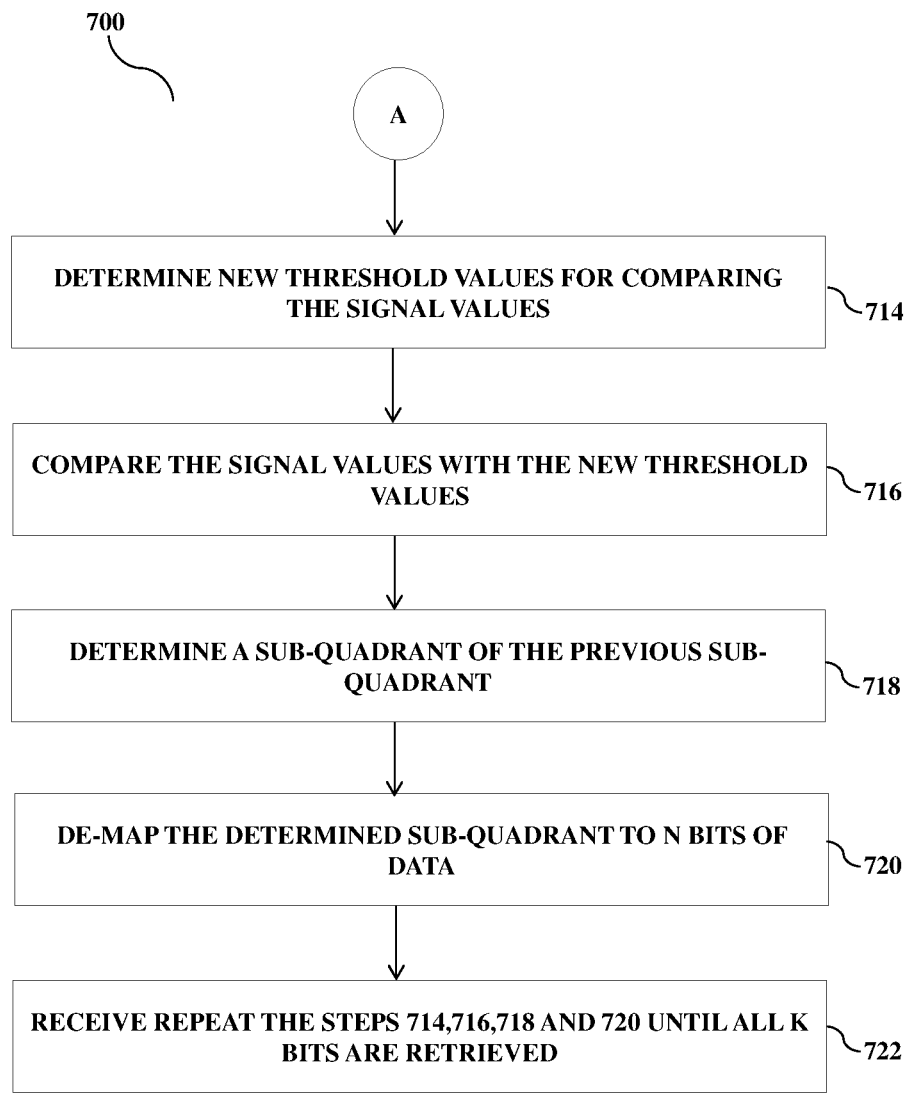

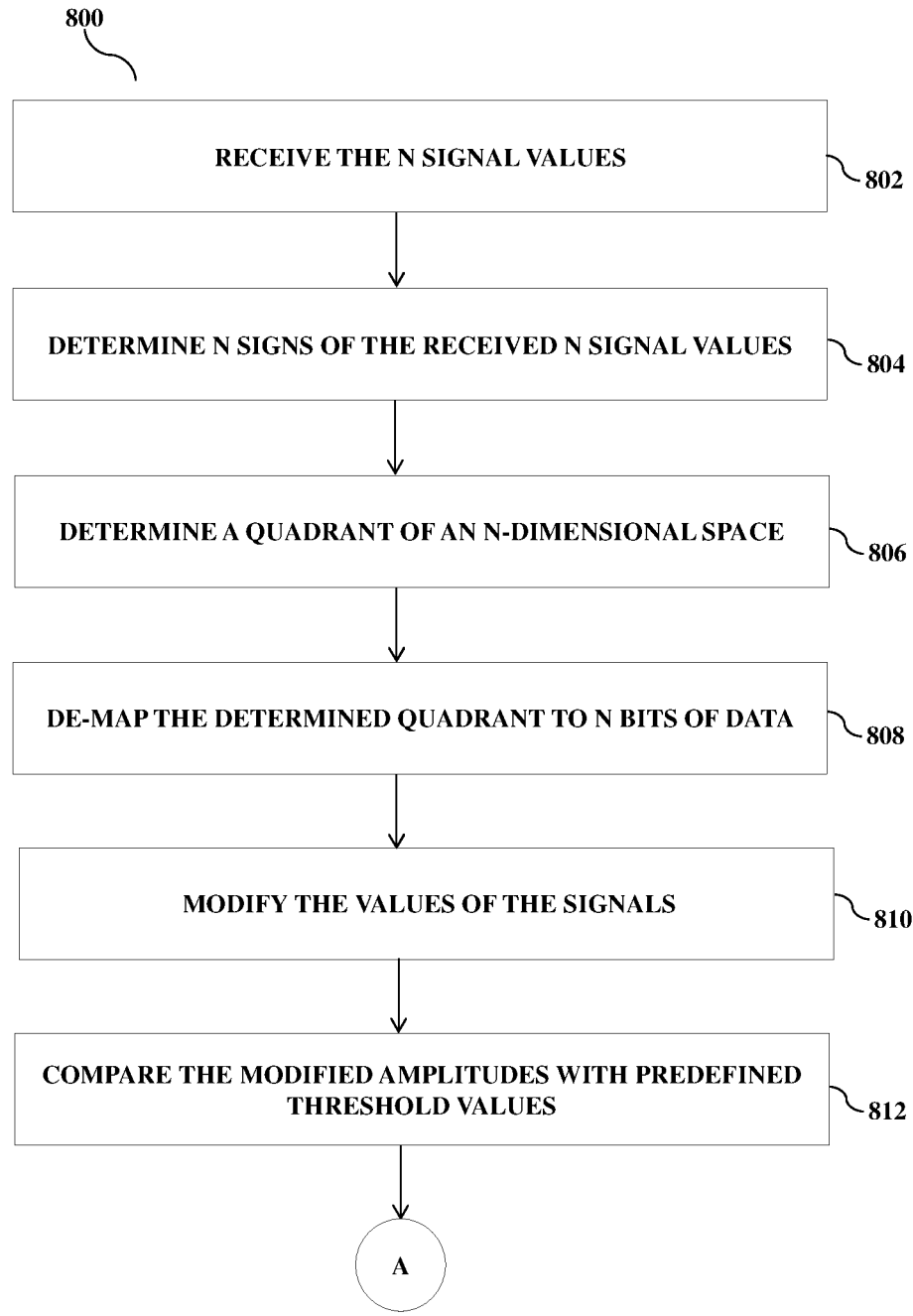

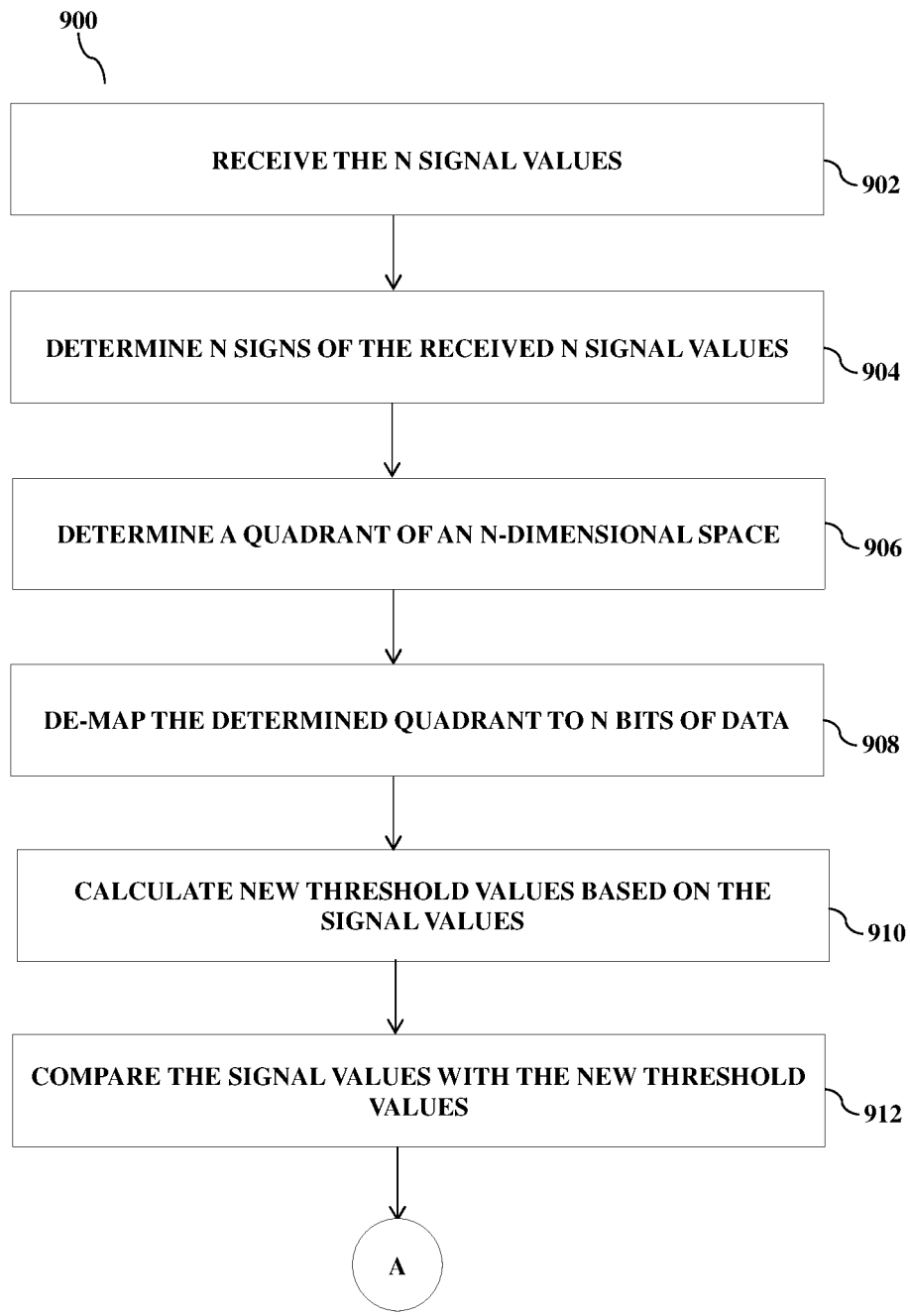

SYSTEM AND METHOD FOR ENCODING AND DECODING DATA

TECHNICAL FIELD

The disclosure relates generally to data transmission systems and more particularly to N-dimensional constellation encoding and decoding techniques deployed in data transmission systems. The present application is based on, and claims priority from an Indian application number 201741017628 filed on May 19, 2017 the disclosure of which is hereby incorporated by reference herein.

BACKGROUND

Typically, multidimensional constellation encoding and decoding techniques involve mapping of 'K' bits onto '$2^K$' points in an N-dimensional Euclidean space ($R^N$), where R denotes set of real numbers. The mapping is done in such a way that all points lie within a specified distance from a particular origin. Some of the traditional well-known constellation coding techniques utilized in the field of data transmission systems are Quadrature Phase Shift Keying (QPSK) schemes, Quadrature Amplitude Modulation (QAM) schemes, and their variants. Such schemes help to improve the reliability of the data transmission system in terms of bit error rate (BER).

Usually, the data transmission systems deploy N-dimensional Phase Shift Keying (PSK), where N is any positive integer greater than 1 or Quadrature Amplitude Modulation (QAM) constellations techniques for transmission of binary information over communication channels to combat the effects of noise over the channel. Moreover, in order to achieve better robustness against noise, the constellation symbols (also referred as points) are rearranged with 'Gray' coding techniques (also known as reflected binary code) to ensure that most of the adjacent symbols differ in a bit. Due to such arrangements of symbols in the constellation, the resulting coding schemes do not admit simple encoding and decoding algorithms.

Furthermore, the standard existing methods used for such coding schemes are the use of look-up tables for encoding the bits at the transmitter end and minimum distance decoding with look-up tables at the receiver end. Moreover, depending on channel conditions present in adaptive data transmission systems, the number of bits transmitted over a channel is varied. Due to variations in a number of bits, the encoding and decoding methods require too many look-up tables and take more time to encode and decode the bits.

SUMMARY

In order to solve at least some of the above mentioned problems, there exists a need for a data transmission system comprising encoding and decoding techniques that admits fast processes for encoding and decoding data and provides good BER performance.

According to some examples of the present disclosure, a method of encoding K bits of data, wherein K is a multiple of N is provided. The method uses a constellation encoder to perform the mentioned steps. The method includes a first step of mapping N consecutive bits of the K bits of data, starting from either its least significant bit or its most significant bit, to a point within a quadrant out of $2^N$ quadrants of an N-dimensional space. The method further includes a second step of mapping the subsequent contiguous N consecutive bits of the K bits of data, to a point within a sub-quadrant out of $2^N$ quadrants of the N dimensional space within the previous quadrant. The method includes repeating the second step until all K bits of data have been mapped. Lastly, the method includes a third step of obtaining N coordinate values of N consecutive bits of the data mapped last, wherein the N coordinate values represent the encoded code word for the K bits of data.

According to additional examples of the present disclosure, a method of retrieving K bits of data from encoded code word, received by a receiver is provided. The method uses a constellation decoder to perform the mentioned steps. The method comprises a first step of receiving the N signal values; wherein the received N signal values are modulated signals using the encoded code word for the K bits of data. The method comprises a second step of determining N signs of the received N signal values; wherein the N signs are determined in a sequence received. The method comprises a third step of using the pattern of the signs in the sequence, determining a quadrant of an N dimensional space determined by the pattern of signs. The method comprises a fourth step of de-mapping the determined quadrant to N bits of data based on the mapping used to encode N bits to a point in one quadrant of N dimensional space for determining first N bits of K bits of data. The method comprises a fifth step of comparing each signal value with a corresponding predetermined threshold and based on the results of the comparison, determining a sub-quadrant of the quadrant determined at fourth step. The method comprises a sixth step of de-mapping the determined sub-quadrant to N bits of data, based on the mapping used to encode N bits to a point in one quadrant of N dimensional space for determining subsequent N bits of K bits of data. The method comprises a seventh step of determining new threshold values for comparing the signal values based on the sub-quadrant previously determined. The method comprises an eighth step of comparing the signal values with the new threshold values. The method comprises a ninth step of determining a sub-quadrant of the previous sub-quadrant, based on the results of the comparisons. The method comprises a tenth step of de-mapping the determined sub-quadrant to N bits of data based on the mapping used to encode N bits to a point in one quadrant of N dimensional space. Lastly, the method comprises, a step of repeating the seventh, eighth, ninth, and tenth step until all K bits are retrieved.

According to yet additional examples of the present disclosure, a method of retrieving K bits of data from encoded code word, received by a receiver is provided. The method uses a constellation decoder to perform the mentioned steps. The method comprises a first step of receiving the N signal values; wherein the received N signal values are modulated signals using the encoded code word for the K bits of data. The method comprises a second step of determining N signs of the received N signal values; wherein the N signs are determined in a sequence received. The method comprise a third step of using the pattern of the signs in the sequence, determining a quadrant of an N dimensional space determined by the pattern of signs. The method comprises a fourth step of de-mapping the determined quadrant to N bits of data based on the mapping used to encode N bits to a point in one quadrant of N dimensional space for determining first N bits of K bits of data. The method comprises a fifth step of modifying the values of the signals such that a point in N dimensional space defined by coordinates having the value with their respective signs is transposed to a quadrant of the N dimensional space having all N coordinates being positive. The method comprises a sixth step of comparing the modified amplitudes with predefined threshold values to determine a sub-quadrant of N dimensional space within the quadrant of N dimensional space with all N coordinates being positive. The method comprises a seventh step of de-mapping the determined quadrant to N bits of data based on the mapping used to encode N bits to a point in one quadrant of N dimensional space. The method comprises an eighth step of repeating the fifth, sixth, seventh step in sequence, ((K/N)−1) times to retrieve all the K bits.

According to yet another additional examples of the present disclosure, a method of retrieving K bits of data from encoded code word, received by a receiver is provided. The method uses a constellation decoder to perform the mentioned steps. The method comprises a first step of receiving the N signal values; wherein the received N signal values are modulated signals using the encoded code word for the K bits of data. The method comprises a second step of determining N signs of the received N signal values; wherein the N signs are determined in a sequence received. The method comprise a third step of using the pattern of the signs in the sequence, determining a quadrant of an N dimensional space determined by the pattern of signs. The method comprises a fourth step of de-mapping the determined quadrant to N bits of data based on the mapping used to encode N bits to a point in one quadrant of N dimensional space for determining first N bits of K bits of data. The method comprises a fifth step of calculating new threshold values, based on the signal values along with their signs. The method comprises a sixth step of comparing the signal values with the new threshold values to determine a sub-quadrant of N dimensional space within the previous quadrant to which the point belongs. The method comprises a seventh step of de-mapping the determined quadrant to N bits of data based on the mapping used to encode N bits to a point in one quadrant of N dimensional space. The method comprises a step of repeating the fifth, sixth, and seventh step in sequence (K/N−1) times for retrieving all the K bits.

According to yet another example embodiment, an apparatus for encoding data for communication to a receiver is provided. The apparatus includes a constellation encoder configured for encoding K bits of data, wherein K is a multiple of N, wherein the constellation encoder is configured for performing a first step of mapping N consecutive bits of the K bits of data, starting from either its least significant bit or its most significant bit, to a point within a quadrant out of $2^N$ quadrants of an N-dimensional space. The constellation encoder is configured for performing a second step of mapping the subsequent contiguous N consecutive bits of the K bits of data, to a point within a sub-quadrant out of $2^N$ quadrants of the N dimensional space within the previous quadrant. The constellation encoder is configured for repeating the second step until all K bits of data have been mapped and performing a third step of obtaining N coordinates of N consecutive bits of the data mapped last, wherein the N coordinate values represent the encoded code word for the K bits of data.

According to yet another example embodiment, an apparatus for retrieving K bits of data from the transmitted encoded code word is provided. The apparatus comprises a receiver, wherein the receiver comprises a constellation decoder configured for performing a first step of receiving the N signal values; wherein the received N signal values are modulated signals using the encoded code word for the K bits of data. The constellation decoder is configured for performing a second step of determining N signs of the received N signal values; wherein the N signs are determined in a sequence received. The constellation decoder is configured for performing a third step of using the pattern of the signs in the sequence, determining a quadrant of an N dimensional space determined by the pattern of signs. The constellation decoder is configured for performing a fourth step of de-mapping the determined quadrant to N bits of data based on the mapping used to encode N bits to a point in one quadrant of N dimensional space for determining first N bits of K bits of data. The constellation decoder is configured for performing a fifth step of comparing each signal value with a corresponding predetermined threshold and based on the results of the comparison, determining a sub-quadrant of the quadrant determined at fourth step. The constellation decoder is configured for performing a sixth step of de-mapping the determined sub-quadrant to N bits of data, based on the mapping used to encode N bits to a point in one quadrant of N dimensional space for determining subsequent N bits of K bits of data. The constellation decoder is configured for performing a seventh step of determining new threshold values for comparing the signal values based on the sub-quadrant previously determined. The constellation decoder is configured for performing an eighth step of comparing the signal values with the new threshold values. The constellation decoder is configured for performing a ninth step of determining a sub-quadrant of the previous sub-quadrant, based on the results of the comparisons. The constellation decoder is configured for performing a tenth step of de-mapping the determined sub-quadrant to N bits of data based on the mapping used to encode N bits to a point in one quadrant of N dimensional space. Lastly, the constellation decoder is configured for performing, a step of repeating the seventh, eighth, ninth, and tenth step until all 'K' bits are retrieved.

The summary above is illustrative only and is not intended to be in any way limiting. Further aspects, exemplary embodiments, and features will become apparent by reference to the drawings and the following detailed description.

BRIEF DESCRIPTION OF FIGURES

These and other features, aspects, and advantages of the exemplary embodiments can be better understood when the following detailed description is read with reference to the accompanying drawings in which like characters represent like parts throughout the drawings, wherein:

FIGS. 7A and 7B are flow diagrams illustrating a method for decoding K bits of data, according to an embodiment as disclosed herein;

FIGS. 8A and 8B are flow diagrams illustrating another method for decoding K bits of data, according to an embodiment as disclosed;

FIGS. 9A and 9B are flow diagrams illustrating a yet another method for decoding K bits of data, according to an embodiment as disclosed herein.

Figure 1:
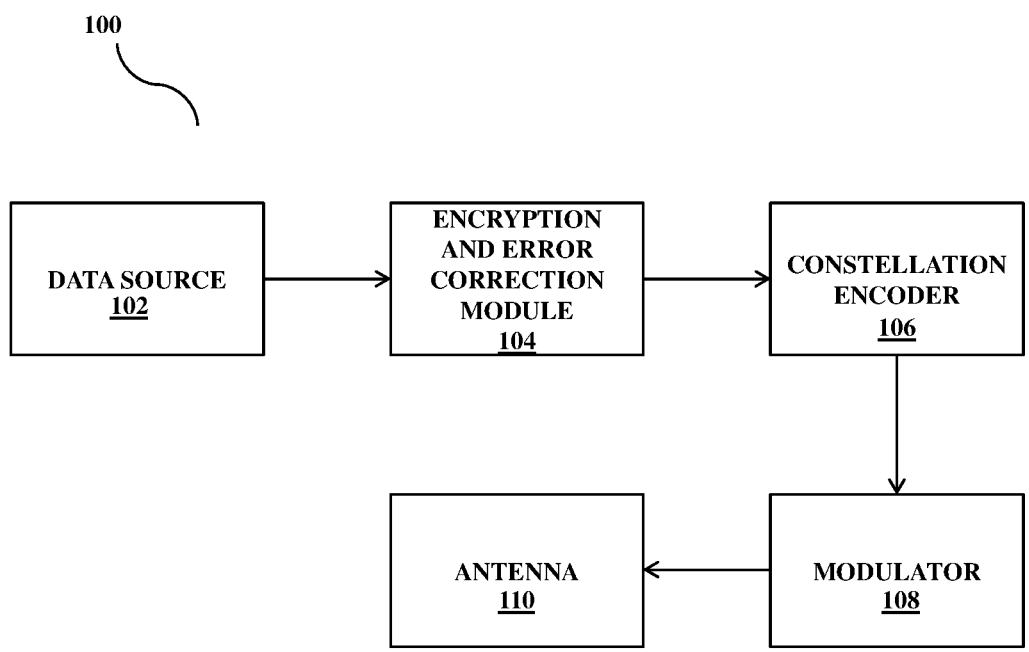
FIG. 1 is a block diagram illustrating various hardware components of a transmitter unit, including a constellation encoder, according to an embodiment as disclosed herein.

Further, skilled artisans will appreciate that elements in the figures are illustrated for simplicity and may not have necessarily been drawn to scale. Furthermore, in terms of the construction of the device, one or more components of the device may have been represented in the figures by conventional symbols, and the figures may show only those specific details that are pertinent to understanding the embodiments of the present invention so as not to obscure the figures with details that will be readily apparent to those of ordinary skill in the art having the benefit of the description herein.

DETAILED DESCRIPTION OF EMBODIMENTS

For the purpose of promoting an understanding of the principles of the invention, reference will now be made to the embodiments illustrated in the figures and specific language will be used to describe the same. It will nevertheless be understood that no limitation of the scope of the invention is thereby intended, such alterations and further modifications in the illustrated system, and such further applications of the principles of the invention as illustrated therein being contemplated as would normally occur to one skilled in the art to which the invention relates.

It will be understood by those skilled in the art that the foregoing general description and the following detailed description are exemplary and explanatory of the invention and are not intended to be restrictive thereof.

The terms "comprises", "comprising", or any other variations thereof, are intended to cover a non-exclusive inclusion, such that a process or method that comprises a list of steps does not comprise only those steps but may comprise other steps not expressly listed or inherent to such process or method. Similarly, one or more devices or sub-systems or elements or structures or components proceeded by "comprises . . . a" does not, without more constraints, preclude the existence of other devices or other sub-systems or other elements or other structures or other components or additional devices or additional sub-systems or additional elements or additional structures or additional components. Appearances of the phrase "in an embodiment", "in another embodiment" and similar language throughout this specification may, but do not necessarily, all refer to the same embodiment.

Unless otherwise defined, all technical and scientific terms used herein have the same meaning as commonly understood by one of ordinary skill in the art to which this invention belongs. The system, methods, and examples provided herein are illustrative only and not intended to be limiting.

At least one exemplary embodiment is generally directed towards an N-dimensional constellation mapping technique for K bits of data, where K is a multiple of N and where N is a positive integer greater than 1. Furthermore, embodiments of the disclosure disclose a constellation point generated by a recursive technique based on number of 'set of data bits' to be coded in N-dimensions. The resulting coding scheme admits fast algorithms for encoding and decoding in digital communication systems and provides good bit error rate (BER) performance.

An implementation of the encoding method for encoding K information bits of data, wherein K is a multiple of N disclosed herein may be explained by considering an example. The example described below illustrates encoding K bits of data, and for value of N which is equal to 2 (N=2).

In one exemplary embodiment, for value of N equal to two (N=2), each constellation point consists of two real values. Such constellation points are used to modulate amplitude and phase of sinusoidal signals (carrier signals). In one embodiment, for encoding K bits of data, where K is a multiple of N, and for the value of N=2, the first step includes mapping of two consecutive bits of the data to a point within a quadrant out of $2^N$ i.e., $2^2$ which is equal to four (4) quadrants of an N-dimensional space. For conciseness, for encoding K bits of data and for the value of N=2, two consecutive bits of the data are mapped to a point within a quadrant out of four (4) quadrants of an N-dimensional space. In one embodiment, the two consecutive bits of the data may start from either its least significant bit (LSB) or its most significant bit (MSB).

In the illustrated exemplary embodiment, after the first step i.e., after mapping two consecutive bits of the data to a point within a quadrant, out of four (4) quadrants of an N-dimensional space, a second step of mapping the subsequent contiguous N consecutive bits (2 consecutive bits in this example) of K bits of data, to a point within a quadrant out of 4 quadrants of the N dimensional space within the previous quadrant is carried out. The second step is repeated until all K bits of data have been mapped.

In the same illustrated exemplary embodiment, after all the K bits of data have been mapped, a third step of obtaining two coordinate values of two consecutive bits of the data mapped last is carried out. The N coordinates values (i.e., 2 in this example), thus obtained represents the encoded code word for the K bits of data. As a result, the K information bits are mapped to a corresponding vectors which are real numbers. The mapping process is a recursive process. The process is carried out recursively till all the K bits are mapped.

Further, these N coordinate values are used for modulating a suitable carrier. In the illustrated embodiment, for N=2, each pair of real values modulate a carrier sine wave. In the illustrated embodiment, the K bits of data are transmitted by driving one or more antennae with the one or more modulated carrier signals. The transmitted data is received by the receiver and the received signal is decoded.

The receiver receives the real values which are decoded to get the information. The real values are estimated values. In some embodiments, an implementation of the decoding method for decoding K information bits of data, wherein K is a multiple of N may be explained by considering an example. The example described below illustrates decoding of K bits of data, and for value of N which is equal to 2 (N=2).

In one example, a method of decoding K bits of encoded data using two estimated values from received modulated signals involves below steps. The method comprises a first step of receiving the two signal values; wherein the received two signal values are modulated signals using the encoded code word for the K bits of data. The method comprises a second step of determining two signs of the received two signal values; wherein the two signs are determined in a sequence received. The method comprise a third step of using the pattern of the signs in the sequence, determining a quadrant of two dimensional space determined by the pattern of signs. The method comprises a fourth step of de-mapping the determined quadrant to two bits of data based on the mapping used to encode two bits to a point in one quadrant of two dimensional space for determining first two bits of K bits of data. The method comprises a fifth step of calculating new threshold values, based on the signal values along with their signs. The method comprises a sixth step of comparing the signal values with the new threshold values to determine a sub-quadrant of two dimensional space within the previous quadrant to which the point belongs. The method comprises a seventh step of de-mapping the determined quadrant to two bits of data based on the mapping used to encode two bits to a point in one quadrant of two dimensional space. The method comprises repeating the fifth, sixth, and seventh steps in sequence (K/2−1) times for retrieving all the K bits (or repeat the steps e, f, and g in sequence until all the K bits have been retrieving)

In addition to the illustrative aspects, exemplary embodiments, and features described above, further aspects, exemplary embodiments of the present disclosure will become apparent by reference to the drawings and the following detailed description.

FIG. 1 is a block diagram illustrating various hardware components of a transmitter unit 100, including a constellation encoder, according to an embodiment of the present disclosure. In particular, the transmitter unit 100 comprises a data source 102, an encryption and error correction module 104, a constellation encoder 106, a modulator 108, and an antenna 110. Each component is described in further details below.

The transmitter unit 100 may be an electronic device that generates and amplifies a carrier wave, modulates the carrier wave with a meaningful signal derived from speech or other sources, and radiates the resulting signal from an antenna. For example, a radio transmitter unit may consists of several elements that operate together to generate radio waves that contain useful information such as audio, video, or digital data. In one embodiment, the main purpose of the transmitter unit 100 is to communicate a message, or information in form of a signal.

The information originates in the information source. In one example, the information source may be the data source 102 as shown in FIG. 1. In another example, the data source 102 may be a digital source configured to provide a source for the data to be transmitted. For instance, the data source 102 may be a file or a particular database on a DBMS. In general, there can be various messages in form of words, group of words, code, symbols, sound signal and the like. However, out of these messages, only the desired message is selected and communicated. Therefore, the main function of information source or the data source 102 is to produce required message which has to be transmitted.

The encryption and error correction module 104 is configured to receive data from the data source 102. The data received by the encryption and error correction module 104 is converted into corresponding encrypted code with the encryption module 104. In one embodiment, the communication is being made secured by encryption. Furthermore, the error correction module 104 detects and corrects the most common kinds of internal data corruption.

The constellation encoder 106 is most important block of the transmitter unit 100. The constellation encoder 106 receives the error free encrypted code. The constellation encoder 106 is configured to perform the conversion of data bits (information bits to be transmitted) to a complex plane. The data bits may be an error free encrypted code. For example, the value at each constellation point in the complex plane represents the input data value to the constellation encoder 106. The output of the constellation encoder 106 is the constellation point in the complex plane, represented by the co-ordinate values which are real values.

The operation of the constellation encoder 106 is described in detail with respect to an N-dimensional coding scheme. More particularly, the constellation encoder 106 is configured for encoding K bits of data, where K is a multiple of N. The constellation encoder 106 is configured to conduct a first step of mapping N consecutive bits of the data, starting from either its least significant bit or its most significant bit, to a point within a quadrant out of $2^N$ quadrants of an N-dimensional space. Further, the constellation encoder 106 is configured to conduct a second step of mapping the subsequent contiguous N consecutive bits of the data, to a point within a quadrant out of $2^N$ quadrants of the N dimensional space within the previous quadrant. Further, the constellation encoder 106 is configured to repeating the second step until all K bits of data have been mapped. Lastly, the constellation encoder 106 is configured to conduct a third step of obtaining N coordinates of N consecutive bits of the data mapped last. The N coordinates represent the encoded code word for the K bits of data.

In one embodiment, the constellation encoder 106 implements an N-dimensional coding scheme. The N-dimensional coding scheme is implemented at a transmitter. For example, in the N-dimensional coding scheme, 'k' binary bits are mapped to a constellation point. In one embodiment, each N consecutive bits of the data is mapped to a constellation point comprising N real values. In one example, such a point may have 'N' coordinates. The co-ordinate values may be used for modulating a suitable carrier.

In one embodiment, the process of encoding may be explained using the first pair of bits for two dimensions. The similar process may be followed for other pairs. The basic idea is to use recursively a simple mapping of a pair of bits to one of the four quadrants denoted as (1,1), (1,−1), (−1,1) and (−1,−1) as shown in Table 1.

TABLE 1

| $b_1$ | $b_2$ | $s_1$ | $s_2$ |
|---|---|---|---|
| 0 | 0 | −1 | 1 |
| 0 | 1 | 1 | 1 |
| 1 | 0 | −1 | −1 |
| 1 | 1 | 1 | −1 |

In one example embodiment, when $b_1 b_2$ denotes the pair of bits, the mapping of co-ordinates is represented as coordinates $s_1$ and $s_2$ as shown in Table 1. For example, the mapping is done as $s_1 = 2b_2 - 1$ and $s_2 = 1 - 2b_1$ In the same example embodiment, for the next pair of bits, the quadrant assigned for the first pair of bits is considered and the quadrant is divided in a similar way. The process of division is continued till all the pairs are considered.

In another example embodiment, for N dimensions N bit groups are considered. For example, first N bits are mapped to $2^N$ quadrants in a manner similar to the example of 2 dimensions. For the subsequent N bits, the mapping to $2^N$ sub quadrants of each of the quadrants is done. The mapping process is repeated for other groups of N bits.

In one embodiment, the algorithm for N dimensions is given below for encoding K bits where, N divides K. For example, let $y_i$, i=1, 2, . . . N denote constellation point associated with the given set of K bits. Then, $y_i$ is detected by the following algorithm. The steps for the encoding algorithm are explained in further detail below.

The preliminary step of the algorithm is to input K bits. For example, let $b_k^t$ denote the $k^{th}$ bit in the $l^{th}$ group of N bits. As a result, the value of k=1, 2 . . . N and l=1, 2, . . . K/N. Further, the value for E1 is set. For example, set $$E1 = 2^{\frac{K}{N}-1} \text{ and } y_1 = 0, i = 1, 2, \ldots N.$$

and, $y_i=0$, $i=1, 2, \ldots N$. For $l=1, 2, \ldots K/N$. The main steps executed by the encoding algorithm include the computation of $y_i$. The formula for the computation is $y_i=y_i+(2b_k^l-1)$ E1 $i=1, 2 \ldots N$. The subsequent steps includes to substitute the value of E1=E1/2 and again execute the step of computation of $y_i$. The output $y_i$, is obtained for $i=1, 2, \ldots N$ after normalization.

In one exemplary embodiment, for the value of 'k' which is equal to nine (k=9), nine (9) bits are used for encoding using the value of N equal to three (N=3) dimensions, and each coordinate value may be represented as three (3) bits. In one example embodiment, in order to transmit 'k' bit data over a channel, k bits (as represented by $b_1, b_2 \ldots b_k$) are first encoded by either 2-dimension or N-dimension (N>2) constellation mapper to N real values, $s_1, s_2, \ldots s_N$. For example, the N-dimensional symbol or a constellation point may be referred to as "$(s_1, s_2 \ldots s_N)$". In one example embodiment, 'M' may denote the number of constellation points. The expected observed result may be $M=2^k$, when N divides k. Thus the assumption is that the constellation is normalized such that $E(s_1^2+s_2^2+\ldots s_N^2)=1$, where E denotes the expectation operator. Subsequently, the real values, representing a constellation point, modulate carrier signals that are sent through an Additive White Gaussian Channel (AWGC).

In one exemplary embodiment, for the value N=2, each pair of real values modulate a carrier sine wave. For the value of N>2 and for the even value of N, N/2 pair of real values are sent on the channel as N/2 signals. Thus, it is observed that when the signal can carry more than two (2) real values, then N values may be sent using appropriate number of signals.

In one embodiment, the constellation encoder 106 implements transmission of multidimensional symbols. The sine wave carriers with a given frequency can be implemented only for conveying two (2) dimensional symbols. Most of the current data transmission systems are based on 2 dimensional constellations. The technique disclosed herein utilizes such sine wave carriers to transmit multidimensional symbol components. The multidimensional symbol components are grouped as several pairs as 2 dimensional symbols.

The modulator 108 is configured for modulating one or more carrier signals. The one or more of an amplitude and a phase of the one or more carrier signals are modulated, proportional to the values of the encoded code word which is obtained by the constellation encoder 106. As mentioned above, the coordinate values which are N real values may be used for modulating a suitable carrier. The modulator 108 is configured to receive the conversion of data bits to the complex plane consequently passed on by the constellation encoder 106. Subsequently, the modulator 108 performs the modulation by varying one or more properties of a periodic waveform, called the carrier signal, with a modulating signal that typically contains information to be transmitted.

The antenna 110 is configured to receive the modulated signal. The antenna 110 is driven for transmitting K bits of data with the one or more modulated carrier signals. Examples of antenna include, but are not limited to SISO (Single input single output), SIMO (Single input multiple output), MISO (Multiple input single output) and MIMO (Multiple input multiple output). The manner in which the transmitted signal is received and decoded by a receiver is described in detail below.

Figure 2:
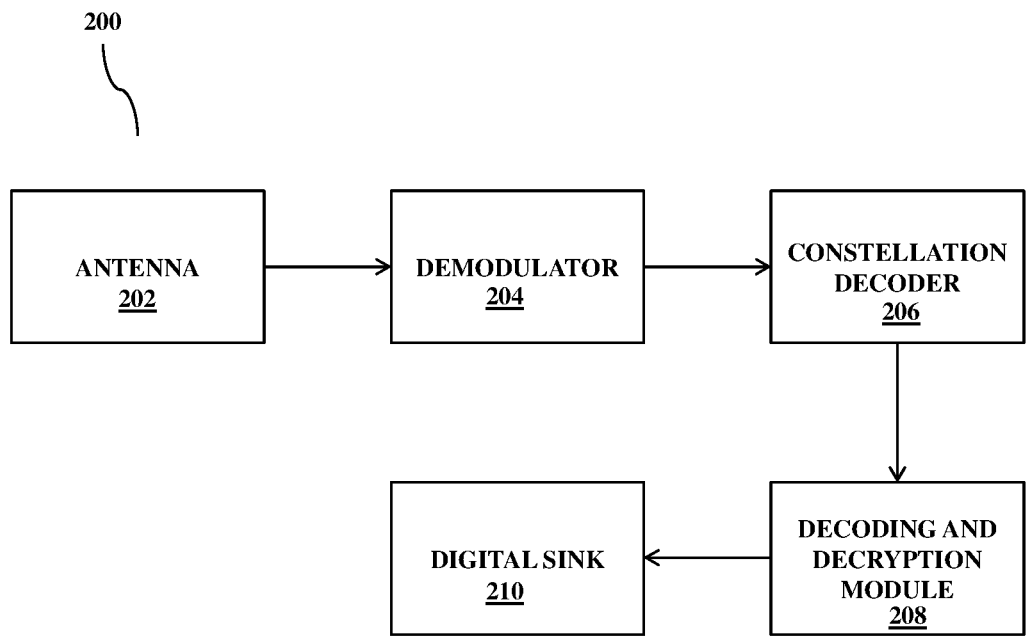
FIG. 2 is a block diagram illustrating various hardware components of a receiver unit, including a constellation decoder, according to an embodiment as disclosed herein.

FIG. 2 is a block diagram illustrating various hardware components of a receiver unit 200, including a constellation decoder, according to an embodiment of the present disclosure. In particular, the receiver unit 200 comprises an antenna 202, a demodulator 204, a constellation decoder 206, a decoding and decryption module 208 and a digital sink 210. Each component is described in further details below.

The receiver unit 200 may be a radio receiver, an electronic device that receives radio waves through the antenna 202 and converts the received information to a usable form. In one embodiment, the antenna 202 may be single antenna or a plurality of multiple antennas at a receiver front end. Examples of antenna include, but are not limited to SISO, MISO or a combination thereof. The antenna 202 intercepts radio waves and converts them to tiny alternating currents which are applied to the receiver, and the receiver extracts the desired information. The receiver unit 200 uses electronic filters to separate the desired radio frequency signal from all the other signals picked up by the antenna 202, an electronic amplifier to increase the power of the signal for further processing, and finally recovers the desired information through demodulation process. The information produced by the receiver unit 200 may be in the form of sound (an audio signal), images (a video signal) or digital data.

In one embodiment, the receiver unit 200 receives the real values which are decoded to get the information. Further, the receiver unit 200 is configured for processing the received signal to obtain estimates of N symbol values (also referred as constellation point). The estimated values from received signals are the modulated signals which are modulated using the encoded N values encoded by the constellation encoder 106 of FIG. 1.

The demodulator 204 is configured to recover the information content from the modulated carrier wave. The signal output of the demodulator 204 may represent sound (an analog audio signal), images (an analog video signal) or binary data (a digital data).

The constellation decoder 206 is most important block of the receiver unit 100. In one embodiment, for a given received symbols the constellation decoder 206 delivers the best estimate of the K bits of data to the digital sink 210.

The operation of the constellation decoder 206 is described in detail with respect to an N-dimensional coding scheme. In one embodiment, the constellation decoder 206 is configured for decoding K bits of encoded data using N estimated values from received signals that have been modulated using the encoded N values and have been encoded by the constellation encoder 106 of FIG. 1.

In one embodiment, the constellation decoder 206 works recursively backwards to find estimates of transmitted bits in groups of N bits just like the encoding method. The structure of the coded word facilitates fast decoding.

In one embodiment, the constellation decoder 206 is configured to operate in one of several ways. The embodiments described below suggest different decoding approaches performed by the constellation decoder 206.

In one exemplary embodiment, the inputs for the constellation decoder 206 are received symbol components. For example, the received symbols components may be represented as $r_i$, $i=1, 2, \ldots N$. In another exemplary embodiment, the outputs of the constellation decoder 206 may be represented as: $\hat{b}_i$, $i=1, 2, \ldots K$, where, $\hat{b}_i$ denotes $i^{th}$ estimated bit.

In one embodiment, the first approach followed by the constellation decoder 206 includes the use of N, if then else, conditions to determine first N bits of K bits of data. The process is repeated K divided by N times with modified conditions for if then else statements.

In another embodiment, the second approach followed by the constellation decoder 206 provides the determination sign of each $r_i$ to find the quadrant in which the received symbol lies. For example, the information determined is utilized to estimate the first N bits. In order to estimate the next N bits, the received symbol is transposed to the all positive component quadrant and the process is repeated till all bits are estimated.

In yet another embodiment, the third approach followed by the constellation decoder 206 provides the determination sign of each $r_i$, The sign of each $r_i$ is to find the quadrant in which the received symbol lies. The sign of each $r_i$ is used to estimate the first N bits. In order to estimate the next N bits, a modified threshold is calculated of each $r_i$ with reduced threshold to determine which part of the quadrant the point ($r_i$, i=1, 2, ... N) lies. The information with respect to modified threshold is utilized to estimate next N bits. The process is repeated till all bits are estimated. This method essentially reverses the steps used in encoding.

In one embodiment, when multidimensional symbols are used with each signal carrying only 2 symbols, there will be a delay at the receiver before decoding is done. For N dimensional coding with N even, there will be a decoding delay of N/2 signal duration. This is due to the fact that, the receiver needs to receive all the N symbols before decoding the bits. However, decoding bits in higher dimension gives better BER as the noise sphere around each constellation point becomes sharper due to sphere hardening effect.

Since, the above mentioned decoding approaches is configured to find the nearest constellation point for a given received point, the above described approaches are equivalent in terms of BER though the number of lines of code may be different. The algorithms and/or approaches described herein are much simpler than the look up table methods for Gray coded constellations which requires minimum distance decoding by searching. The approaches including look up table methods for Gray coded constellations are inefficient for large constellations and are not suitable for adaptive modulation applications. The manner in which the data is encoded and decoded in an adaptive communication systems is described in detail below.

Figure 3:
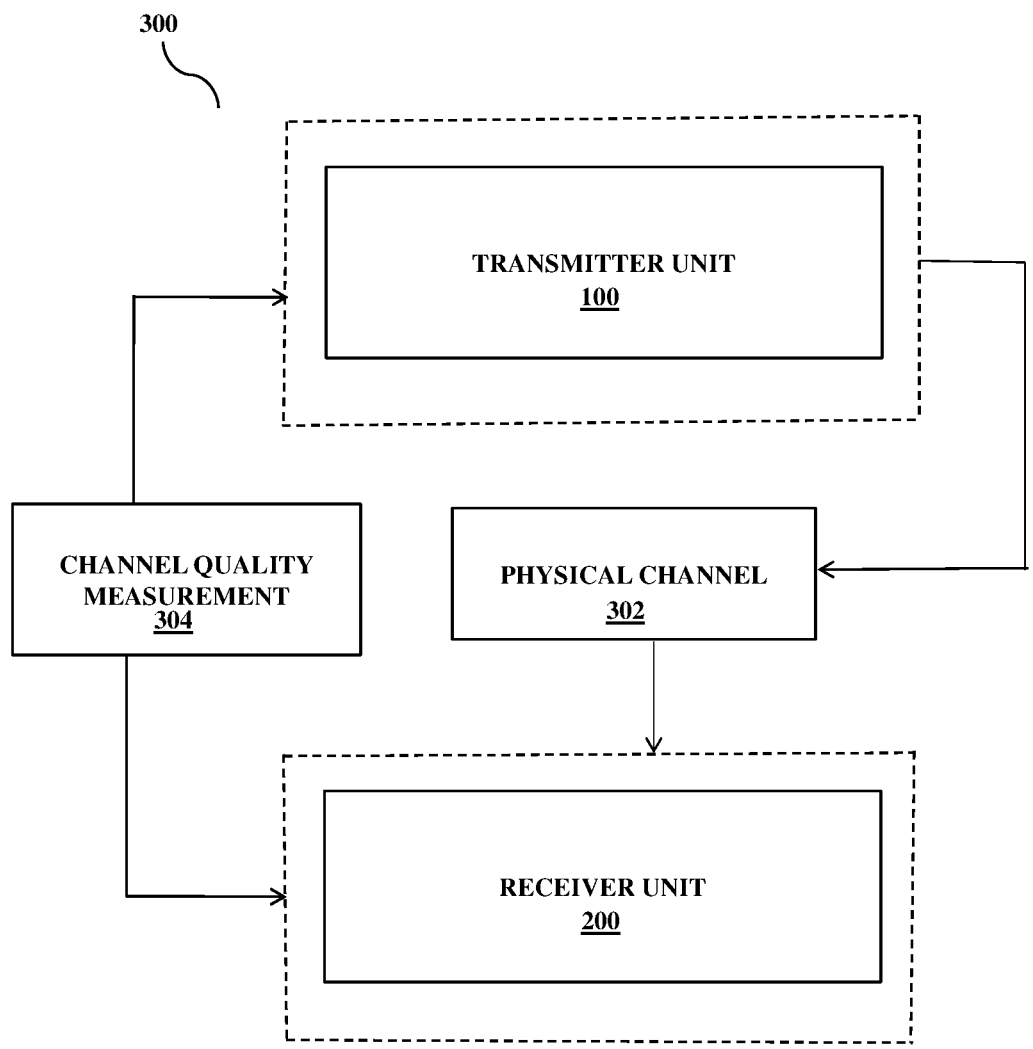
FIG. 3 is a block diagram illustrating various hardware components of an adaptive communication system, according to an embodiment as disclosed herein.

FIG. 3 is a block diagram illustrating various hardware components of an adaptive communication system 300 of one embodiment of an adaptive communication system 300, according to an embodiment of the present disclosure. In particular, FIG. 3 comprises the transmitter unit 100 comprising the constellation encoder 106 and the receiver unit 200 comprising the constellation decoder 206 communicatively coupled via a physical channel 302. In addition, a channel quality measurement module 304 is coupled to the transmitter unit 100 and the receiver unit 200 as shown. Each component is described in further details below.

In one example, the adaptive communication system 300 automatically uses feedback information obtained from the receiver unit 200 and given by the channel quality measurement module 304. The feedback information is utilized to dynamically modify one or more components of the transmitter unit 100, operational parameters of the constellation encoder 106 and the constellation decoder 206 to improve performance of the transmitter unit 100 and the receiver unit 200 and/or to resist degradation. In one embodiment, the channel quality measurement module 304 provides a means to make repeatable channel response measurements such as group delay, phase linearity, and magnitude linearity. The channel quality measurement module 304 provides an estimate of the parameters based on channel conditions of the physical channel 302. The channel quality parameters such SNR, channel dispersion parameters and Doppler frequency are the parameters that determine the channel utilization, quality of the channel, noise floor, error rate and retry rate. For example, the channel quality parameters acts as an indicator carrying the information on how good/bad the communication channel quality is. In one embodiment, the adaptive communication system 300 requires measurement of channel quality parameters such as SNR, channel dispersion parameters and Doppler frequency and the like. In one embodiment, based on the measurements needed for the adaptive communication system, suitable constellation coding scheme may be utilized to increase throughput and quality of service.

In one example embodiment, the parameters estimated by the channel quality measurement module 304 based on channel conditions of the physical channel 302 acts as a feedback through a feedback link to the transmitter unit 100 which chooses the right constellation coding approach to be used. As a result, by properly varying the choice of the constellation coding approach, the adaptive communication system 300 achieves a better throughput over the link. The constellation coding approach for the value of N equal to two (N=2) is described in detail below.

In some embodiments, an implementation of the encoding method for encoding K bits of data, wherein K is a multiple of N disclosed herein may be explained by considering an example for value of N equal to two (N=2).

Figure 4:
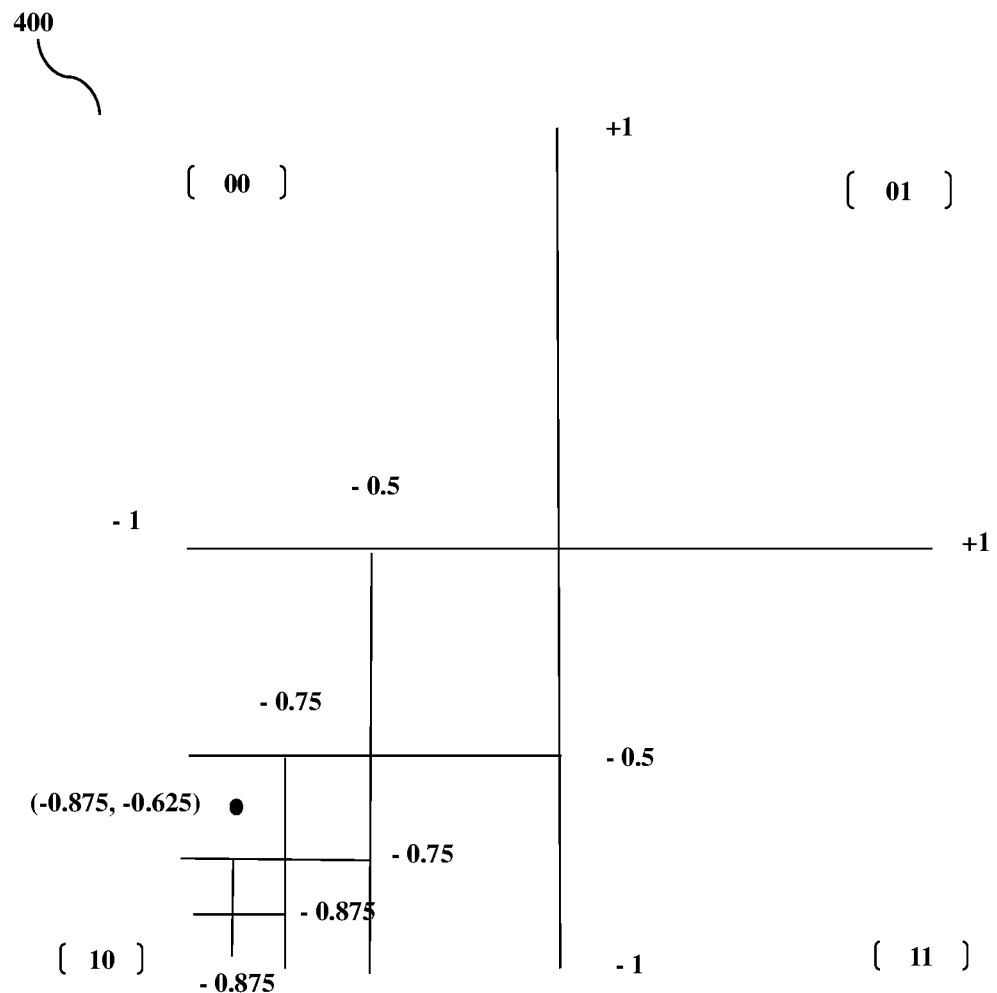
FIG. 4 and FIG. 5 illustrate an example scenario for encoding and decoding K bits of data according to an embodiment as disclosed herein.
Figure 5:
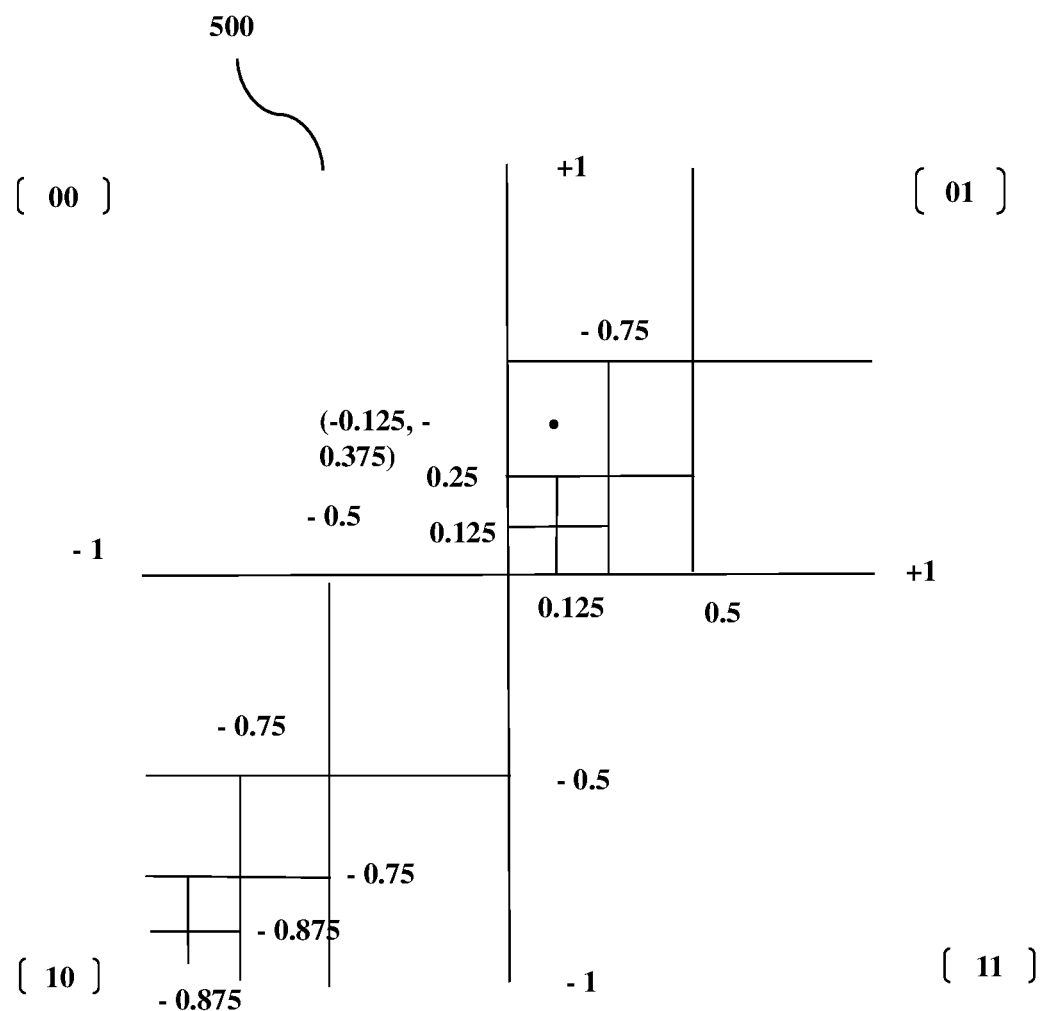

FIG. 4 and FIG. 5 illustrate an example scenario for encoding (graphical representation shown by 400) and decoding K bits of data (graphical representation shown by 500), wherein K is a multiple of N, and N=2, in an N-dimensional space, according to an embodiment of the present disclosure. In one embodiment, K bits are mapped to a point in the N-dimensional constellation. In one exemplary embodiment, for value of N equal to two (N=2), each constellation point consists of two real values. The constellation point may have two coordinates. Such constellation points are used to modulate amplitude and phase of sinusoidal signals The following is an explanation of how the K bits of data is encoded that results in the code, with reference to FIG. 4. The example data to be encoded has six bits 10 10 10. It is encoded using a two dimensional space. That is to say, K=6 and N=2. The two dimensional space has four ($2^N=2^2=4$) quadrants. The maximum magnitude of each quadrant is chosen as 1 in the example. Thus a point in any of the quadrants can have a coordinates with a maximum magnitude of 1 with an appropriate sign. Each of the four combinations of two bits (00, 01, 11 and 10) is mapped to one of the four quadrants, clockwise, starting from the top left quadrant. This is just one way of mapping and any other way of mapping is equally valid. Starting from the least significant bit, two bits (10) are first mapped to the bottom left quadrant. This quadrant is now divided into four sub-quadrants, with the origin with the coordinates (−0.5, −0.5). Each sub-quadrants now has coordinates with a maximum magnitude of 0.5. Next, the next two contiguous consecutive bits of 10 is mapped to the bottom left sub-quadrant. This quadrant is now divided into four sub-quadrants, with the origin with the coordinates (−0.75, −0.75). Each sub-quadrants now has coordinates with a maximum magnitude of 0.25. Next, the next two contiguous consecutive bits of 10 is mapped to the bottom left sub-quadrant and a point is chosen to represent the mapped bits. This point has a coordinates with half of the maximum magnitude of the sub-quadrant. That means, within that sub-quadrant it has the coordinates (−0.125, −0.125). With reference to the overall two dimensional space chosen, the coordinates of this point is (−0.875, −0.875). These coordinates constitute the code word for the original K bits of data.

Thus, it is seen that, the method of encoding involves division of quadrants and is recursive and continues till all the N consecutive bits are encoded. From a communication point of view it also means that first pair of bits enjoy more noise immunity compared to $2^{nd}$ pair of bits. Therefore, in the mentioned 4 bit constellation coding scheme, the first pair of bits enjoy noise immunity of QPSK systems while the next pair gets the noise immunity of 16-QAM. However, in a standard 16-QAM all four bits get only 16-QAM noise immunity.

Before decoding example is described, a very brief description of the transmitter and the receiver are provided here for understanding the methods disclosed by the present disclosure. These methods are known and are not a part of the essential features of the methods disclosed by the present disclosure. Once the encoder has encoded the data and obtained the code word, the code word is used to modulate a carrier signal. The modulated signal thus contains the information of both magnitudes and signs of the two coordinates constituting the code word. This modulated signal is suitably amplified and transmitted through the communication medium. One example of transmission is through space as radio frequency signals by driving a transmitting antenna. The radio signals travel through space and can be received by a suitable receiver. Since the modulated signal contains the information in the form of the phase angle of the transmitted signal, an unmodulated carrier is also transmitted as a reference signal. The radio signals are received by a receiving antenna. The signal from the antenna undergoes processing such as amplification, filtering and so on. A demodulator demodulates the signal and digitally processes the signal to estimate the values of the coordinates constituting the code word and their signs. It is these values and signs that the decoder uses to decode the coded word and retrieve the K bits of data that was decoded. Now the decoding methods disclosed in this disclosure are described with the assumption that the decoder receives the estimated values and their signs as its input. We also assume that the code word that the decoder receives the code word that was generated in the description of the encoding method, described above. The code word being (−0.875, −0.875). The decoding example is illustrated in FIG. 5 and described below.

In one example embodiment, one of the decoding method is described below.

The decoder receives the values (−0.875, −0.875). It first determines the signs which are '−' and '−' in this case. This indicates that the code word belonged to the bottom left quadrant of the two dimensional space. The decoder has the information of the mapping used in the encoding. Using it, it de-maps the quadrant to the two bits, viz., 01. The decoder compares the two values with a threshold value of −0.5 and −0.5. The result is that both the values are lesser than 0.5. This indicates that the point lies in the lower left sub-quadrant. As before, with the information the mapping, the decoder de-maps the quadrant to the bits 10. The process is repeated with the threshold values as −0.75 and −0.75. The result of this comparison is also that both the values are less than −0.75. This places the point in the lower left quadrant.

Now, irrespective of the actual value of the code word, the last two bits are de-mapped to 10. This completes the decoding and retrieving the 6 bit data from just two values along with their signs. Thus the decoder calculates the pairs of threshold values based on the results of the last comparison. To illustrate this let us assume that the code word had the values (−0.625, −0.875). This is shown in the figure as a dot with the coordinates in brackets next to it. The result of the previous comparison then would that the x coordinate is greater than −0.75 and the y coordinate is less than −0.75. This leads to the result that the point lies in the upper left coordinate. This would be de-mapped to 00 as the last decoded bits of the number.

In one example embodiment, second decoding method is described below

The decoder receives the values (−0.875, −0.875). It first determines the signs which are '−' and '−' in this case. This indicates that the code word belonged to the bottom left quadrant of the two dimensional space. The decoder has the information of the mapping used in the encoding. Using it, it de-maps the quadrant to the two bits, viz., 01. Next the decoder modifies the values of the code word such that the point in the lower left quadrant representing the code word of (−0.875, −0.875) is translated to a point in the quadrant with all coordinates having positive values. This is achieved by adding +1 to all the coordinates with a negative sign. The decoder now has to deal with only positive numbers. The decoder now compares the values 0.125 and 0.125 with 0.5 and 0.5. The result is that both the values are lower than 0.5. This places the point in the lower left sub-quadrant of the top right quadrant. The lower left sub-quadrant is de-mapped to 10 as before. The values are now compare with 0.25 and 0.25. This comparison shows that the two values are both lower than 0.25. This locates the point in the lower left sub-quadrant of the previous sub-quadrant. This is de-mapped to 10, as before. This completes the decoding and retrieving the 6 bit data from just two values along with their signs. Thus depending on the results of each comparison the decoder calculates the next pair of thresholds to compare the values with. The point with the coordinates (−0.875, −0.625) of the previous example would be translated to (0.125, 0.325) in this method. So the results of the previous comparison would be that the x coordinate is less than 0.25 and the y coordinate is greater than 0.25. This locates the point in the upper left sub-quadrant. This would be de-mapped to 00 as before.

In one embodiment, the constellation encoder 106 and constellation decoder 206 comprises a controller (not shown) configured to execute computer-readable instructions to carry out its functionalities as described above. In some other embodiments, a manner in which the constellation encoder 106 and constellation decoder 206 operates is described in further detail below. The operation of constellation encoder 106 of FIG. 1 is described in the flowchart as shown in FIG. 6.

Figure 6:
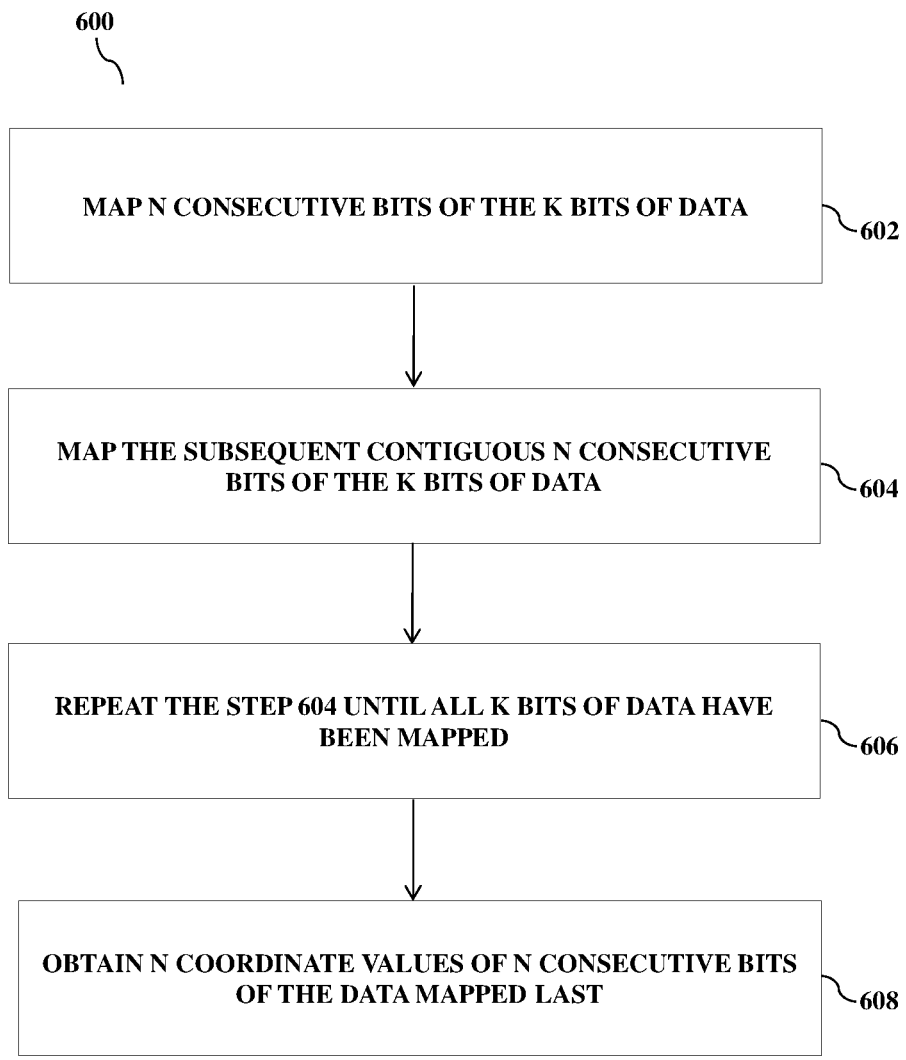
FIG. 6 is a flow diagram illustrating a method for encoding K bits of data, according to an embodiment as disclosed herein.

FIG. 6 is a flow diagram illustrating a method 600 for encoding K bits of data, wherein K is a multiple of N. FIG. 6 may be described from the perspective of a controller that is configured to execute computer-readable instructions to carry out the functionalities of the constellation encoder 106 of FIG. 1. In particular, the steps as described in FIG. 6 may be executed for obtaining the encoded code word for the K bits of data. Some examples may relate to a process for an N-dimensional constellation encoding method for transmission of data bits over a physical channel. Each step is described in further detail below.

At step 602, the N consecutive bits of the K bits of data, starting from either its least significant bit or its most significant bit are mapped to a point within a quadrant out of $2^N$ quadrants of an N-dimensional space. At step 604, the subsequent contiguous N consecutive bits of the K bits of data, are mapped to a point within a sub-quadrant out of $2^N$ quadrants of the N dimensional space within the previous quadrant. At step 606, the step 604 is repeated until all K bits of data have been mapped. At step 608, the N coordinate values of N consecutive bits of the data mapped last are obtained. The N coordinate values represents the encoded code word for the K bits of data.

The operation of constellation decoder 206 of FIG. 2 is described in the flowchart as shown in FIGS. 7, 8 and 9.

FIGS. 7A and 7B (hereinafter referred to as FIG. 7) are flow diagrams illustrating a method for decoding K bits of data from the encoded code word of FIG. 6. FIG. 7 may be described from the perspective of a controller that is configured to execute computer-readable instructions to carry out the functionalities of the constellation decoder 206 of FIG. 2. In particular, the steps as described in FIG. 7 may be executed for decoding K bits of encoded data. Some examples may relate to a process for an N-dimensional constellation decoding method using N estimated values from received signals that have been modulated using the encoded N values. Each step is described in further detail below.

At step 702, the N signal values are received. The received N signal values are modulated signals using the encoded code word for the K bits of data. At step 704, the N signs of the received N signal values are determined, wherein the N signs are determined in a sequence received. At step 706, using the pattern of the signs in the sequence, a quadrant of an N dimensional determining space determined. At step 708, the determined quadrant are de-mapped to N bits of data based on the mapping used to encode N bits to a point in one quadrant of N dimensional space for determining first N bits of K bits of data. At step 710, each signal value is compared with a corresponding predetermined threshold and based on the results of the comparison determining a sub-quadrant of the quadrant determined in step 708. At step 712, the determined sub-quadrant is de-mapped to N bits of data based on the mapping used to encode N bits to a point in one quadrant of N dimensional space for determining subsequent N bits of K bits of data. At step 714, new threshold values are determined for comparing the signal values based on the sub-quadrant previously determined. At step 716, the signal values are compared with the new threshold values. At step 718, a sub-quadrant of the previous sub-quadrant is determined based on the results of the comparisons. At step 720, the determined sub-quadrant is de-mapping to N bits of data based on the mapping used to encode N bits to a point in one quadrant of N dimensional space. The process steps 714 to 720 are repeated until all K bits are retrieved.

Figure 8B:
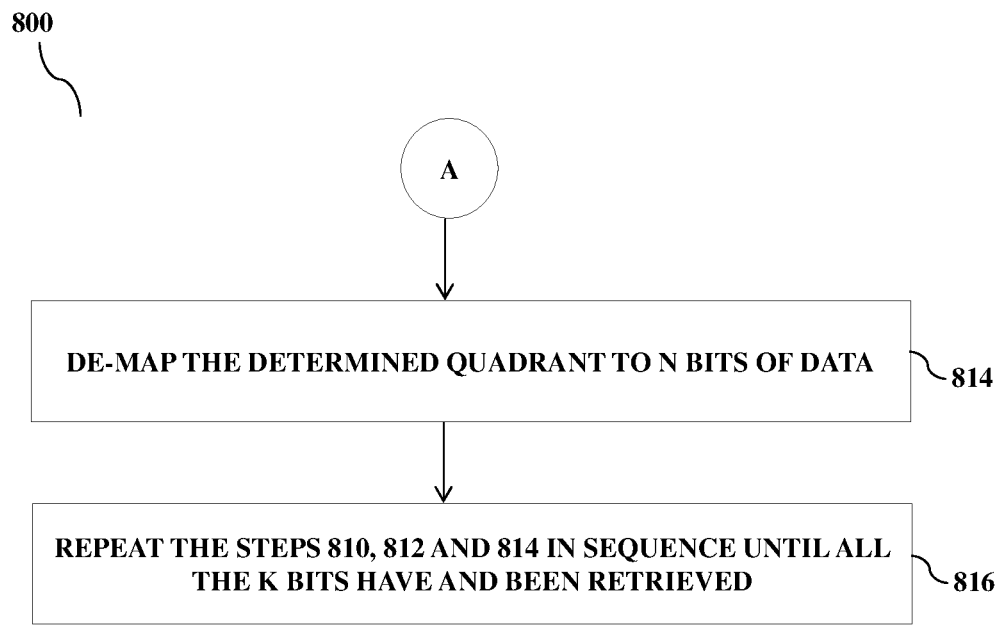

FIGS. 8A and 8B (hereinafter referred to as FIG. 8) are flow diagrams illustrating another method for decoding K bits of data from the encoded code word of FIG. 6.

At step 802, the N signal values are received. The received N signal values are modulated signals using the encoded code word for the K bits of data. At step 804, the N signs of the received N signal values are determined, wherein the N signs are determined in a sequence received. At step 806, using the pattern of the signs in the sequence, a quadrant of an N dimensional determining space is determined. At step 808, the determined quadrant are de-mapped to N bits of data based on the mapping used to encode N bits to a point in one quadrant of N dimensional space for determining first N bits of K bits of data. At step 810, the values of the signals are modified such that a point in N dimensional space defined by coordinates having the value with their respective signs is transposed to a quadrant of the N dimensional space having all N coordinates being positive. At step 812, the modified amplitudes are compared with predefined threshold values to determine a sub-quadrant of N dimensional space within the quadrant of N dimensional space with all N coordinates being positive. At step 814, the determined quadrant are de-mapped to N bits of data based on the mapping used to encode N bits to a point in one quadrant of N dimensional space. At step 816, the steps 810, 812, and 814 are repeated in sequence, ((K/N)−1) times to retrieve all the K bits.

Figure 9B:
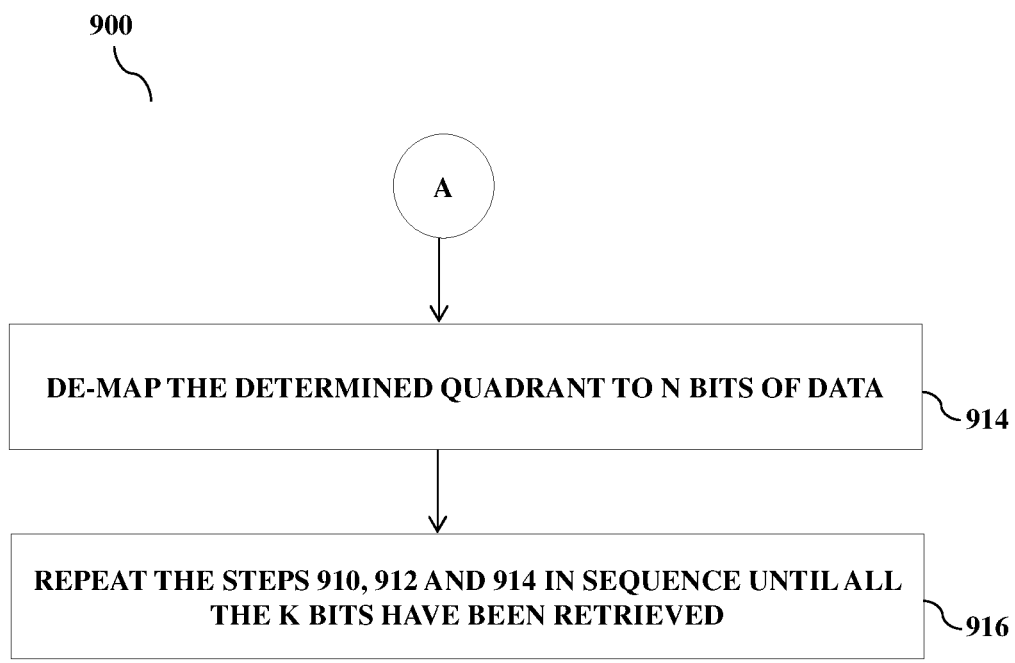

FIGS. 9A and 9B (hereinafter referred to as FIG. 9) are flow diagrams illustrating a yet another method for decoding K bits of data from the encoded code word of FIG. 6. At step 902, the N signal values are received. The received N signal values are modulated signals using the encoded code word for the K bits of data. At step 904, the N signs of the received N signal values are determined, wherein the N signs are determined in a sequence received. At step 906, using the pattern of the signs in the sequence, a quadrant of an N dimensional determining space is determined. At step 908, the determined quadrant are de-mapped to N bits of data based on the mapping used to encode N bits to a point in one quadrant of N dimensional space for determining first N bits of K bits of data. At step 910, based on the signal values along with their signs, calculating new threshold values. At step 912, comparing the signal values with the new threshold values to determine a sub-quadrant of N dimensional space within the previous quadrant to which the point belongs. At step 914, de-mapping the determined quadrant to N bits of data based on the mapping used to encode N bits to a point in one quadrant of N dimensional space. At step 916, the steps 910, 912, and 914 are repeated in sequence (K/N−1) times for retrieving all the K bits.

Since the above mentioned decoding process determines the nearest constellation point for a given received point, the decoding process is equivalent in terms of BER though the number of lines of code may be different.

The encoding and decoding process described herein are much simpler than the look up table methods for Gray coded constellations which requires minimum distance decoding by searching. Such approaches are inefficient for large constellations and are not suitable for adaptive modulation applications. For example, the techniques described herein may be implemented in an adaptive communication system which optimizes the channel throughput performance. The encoding and decoding process described herein can also be used virtually in any multidimensional, multiple input multiple output communication systems in many different ways.

Figure 10:
FIG. 10 illustrates an example scenario of constellation mapping, according to an embodiment as disclosed herein.

FIG. 10 illustrates an example scenario of constellation mapping with two pairs, according to an embodiment of the present disclosure. For example, the pairs, 01 and 01 occupies the sub-quadrant 1002. The pairs, 00 and 00 occupies the sub-quadrant 1001 in FIG. 10. Due to the recursive nature of coding the first pair of bits represent one of the quadrants and next pair of bits represent a sub-quadrant. From a communication point of view it also means that first pair of bits enjoy more noise immunity compared to 2nd pair of bits. Therefore, in the mentioned 4 bit constellation coding scheme, the first pair of bits enjoy noise immunity of QPSK systems while the next pair gets the noise immunity of 16-QAM. However, in a standard 16-QAM all four bits get only 16-QAM noise immunity.

While specific language has been used to describe the disclosure, any limitations arising on account of the same are not intended. As would be apparent to a person skilled in the art, various working modifications may be made to the method in order to implement the inventive concept as taught herein.

The figures and the foregoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

What is claimed is:

1. A method of encoding K bits of data, using a constellation encoder, wherein K is a multiple of N where N is any positive integer greater than 1, the method comprising:
    a first step of mapping N consecutive bits of the K bits of data, starting from either its least significant bit (LSB) or its most significant bit (MSB), to a point within a quadrant out of $2^N$ quadrants of an N-dimensional space;
    a second step of mapping the subsequent contiguous N consecutive bits of the K bits of data, to a point within a sub-quadrant out of $2^N$ quadrants of the N dimensional space within the previous quadrant;
    repeating the second step until all K bits of data have been mapped; and
    a third step of obtaining N coordinate values of N consecutive bits of the data mapped last, wherein the N coordinate values represent the encoded code word for the K bits of data.

2. The method of claim 1, wherein N consecutive bits of the K bits of data starting either from the LSB or MSB or the subsequent contiguous N bits of data are mapped to a point in N dimensional space, wherein the coordinates of the point comprise N real values.

3. A method of modulating one or more carrier signals wherein the method comprises modulating one or more of an amplitude and a phase of the one or more carrier signals, proportional to the values of the encoded code word of claim 1.

4. The method of claim 3, wherein the number of signals modulated is equal in number to half of N wherein N is even.

5. The method of claim 3, wherein the number of signals modulated is equal to a number that is half of a number that is one greater than N, wherein N is an odd number.

6. The method of claim 3, wherein the number of signals modulated is equal to N wherein the amplitude and phase of the N signals are proportional to the values of the coordinates of two contiguous N consecutive bits of the K bits of data, wherein N is an odd number.

7. The method of transmitting K bits of data wherein the method comprises driving one or more antennae with the one or more modulated carrier signals of claim 3.

8. A method of retrieving K bits of data, using a constellation decoder, from the encoded code word transmitted according to claim 7, wherein the method comprises the steps of:
    a. receiving the N signal values; wherein the received N signal values are modulated signals using the encoded code word for the K bits of data;
    b. determining N signs of the received N signal values; wherein the N signs are determined in a sequence received;
    c. using the pattern of the signs in the sequence, determining a quadrant of an N dimensional space determined by the pattern of signs;
    d. de-mapping the determined quadrant to N bits of data based on the mapping used to encode N bits to a point in one quadrant of N dimensional space for determining first N bits of K bits of data;
    e. comparing each signal value with a corresponding predetermined threshold and based on the results of the comparison determining a sub-quadrant of the quadrant determined in step d;
    f. de-mapping the determined sub-quadrant to N bits of data based on the mapping used to encode N bits to a point in one quadrant of N dimensional space for determining subsequent N bits of K bits of data;
    g. determining new threshold values for comparing the signal values based on the sub-quadrant previously determined,
    h. comparing the signal values with the new threshold values;
    i. determining a sub-quadrant of the previous sub-quadrant based on the results of the comparisons;
    j. de-mapping the determined sub-quadrant to N bits of data based on the mapping used to encode N bits to a point in one quadrant of N dimensional space; and
    k. repeating the steps g, h, i, and j until all K bits are retrieved.

9. A method of retrieving K bits of data, using a constellation decoder, from the encoded code word transmitted according to claim 7, wherein the method comprises the steps of:
    a. receiving the N signal values; wherein the received N signal values are modulated signals using the encoded code word for the K bits of data;
    b. determining N signs of the received N signal values; wherein the N signs are determined in a sequence received;
    c. using the pattern of the signs in the sequence, determining a quadrant of an N dimensional space determined by the pattern of signs;
    d. de-mapping the determined quadrant to N bits of data based on the mapping used to encode N bits to a point in one quadrant of N dimensional space for determining first N bits of K bits of data;
    e. modifying the values of the signals such that a point in N dimensional space defined by coordinates having the value with their respective signs is transposed to a quadrant of the N dimensional space having all N coordinates being positive,
    f. comparing the modified amplitudes with predefined threshold values to determine a sub-quadrant of N dimensional space within the quadrant of N dimensional space with all N coordinates being positive;
    g. de-mapping the determined quadrant to N bits of data based on the mapping used to encode N bits to a point in one quadrant of N dimensional space h. repeating the steps e, f, and g in sequence, ((K/N)−1) times to retrieve all the K bits.

10. A method of retrieving K bits of data, using a constellation decoder, from the encoded code word transmitted according to claim 7, wherein the method comprises the steps of:
   a. receiving the N signal values; wherein the received N signal values are modulated signals using the encoded code word for the K bits of data;
   b. determining N signs of the received N signal values; wherein the N signs are determined in a sequence received;
   c. using the pattern of the signs in the sequence, determining a quadrant of an N dimensional space determined by the pattern of signs;
   d. de-mapping the determined quadrant to N bits of data based on the mapping used to encode N bits to a point in one quadrant of N dimensional space for determining first N bits of K bits of data;
   e. based on the signal values along with their signs, calculating new threshold values;
   f. comparing the signal values with the new threshold values to determine a sub-quadrant of N dimensional space within the previous quadrant to which the point belongs;
   g. de-mapping the determined quadrant to N bits of data based on the mapping used to encode N bits to a point in one quadrant of N dimensional space;
   h. repeating the steps e, f, and g in sequence (K/N−1) times for retrieving all the K bits.

11. Apparatus for encoding data for communication to a receiver, the apparatus comprising:
   a constellation encoder configured for encoding K bits of data, wherein K is a multiple of N where N is any positive integer greater than 1, and, wherein the constellation encoder is configured for:
   performing a first step of mapping N consecutive bits of the K bits of data, starting from either its least significant bit (LSB) or its most significant bit (MSB), to a point within a quadrant out of $2^N$ quadrants of an N-dimensional space;
   performing a second step of mapping the subsequent contiguous N consecutive bits of the K bits of data, to a point within a sub-quadrant out of $2^N$ quadrants of the N dimensional space within the previous quadrant;
   repeating the second step until all K bits of data have been mapped; and
   performing a third step of obtaining N coordinates of N consecutive bits of the data mapped last, wherein the N coordinate values represent the encoded code word for the K bits of data.

12. The apparatus of claim 11, wherein N consecutive bits of the K bits of data starting either from the LSB or MSB or the subsequent contiguous N bits of data are mapped to a point in N dimensional space, wherein the coordinates of the point comprise N real values.

13. The apparatus of claim 11, further comprising a modulator configured for modulating one or more carrier signals wherein the method comprises modulating one or more of an amplitude and a phase of the one or more carrier signals, proportional to the values of the encoded code word of claim 11.

14. The apparatus of claim 11, wherein the number of signals modulated is equal in number to half of N wherein N is even.

15. The apparatus of claim 11, wherein the number of signals modulated is equal to a number that is half of a number that is one greater than N, wherein N is an odd number.

16. The apparatus of claim 11, wherein the number of signals modulated is equal to N wherein the amplitude and phase of the N signals are proportional to the values of the coordinates of two contiguous N consecutive bits of the K bits of data, wherein N is an odd number.

17. The apparatus of transmitting K bits of data by driving one or more antennae with the one or more modulated carrier signals of claim 13.

18. An apparatus for retrieving K bits of data from the encoded code word transmitted according to claim 17, wherein the apparatus comprises a receiver configured for:
   a. receiving the N signal values; wherein the received N signal values are modulated signals using the encoded code word for the K bits of data;
   b. determining N signs of the received N signal values; wherein the N signs are determined in a sequence received;
   c. using the pattern of the signs in the sequence, determining a quadrant of an N dimensional space determined by the pattern of signs;
   d. de-mapping the determined quadrant to N bits of data based on the mapping used to encode N bits to a point in one quadrant of N dimensional space for determining first N bits of K bits of data;
   e. comparing each signal value with a corresponding predetermined threshold and based on the results of the comparison determining a sub-quadrant of the quadrant determined in step d;
   f. de-mapping the determined sub-quadrant to N bits of data based on the mapping used to encode N bits to a point in one quadrant of N dimensional space for determining subsequent N bits of K bits of data;
   g. determining new threshold values for comparing the signal values based on the sub-quadrant previously determined,
   h. comparing the signal values with the new threshold values;
   i. determining a sub-quadrant of the previous sub-quadrant based on the results of the comparisons;
   j. de-mapping the determined sub-quadrant to N bits of data based on the mapping used to encode N bits to a point in one quadrant of N dimensional space; and
   k. repeating the steps g, h, i, and j until all K bits are retrieved.

19. An apparatus for retrieving K bits of data from the encoded code word transmitted according to claim 17, wherein the apparatus comprises a receiver configured for:
   a. receiving the N signal values; wherein the received N signal values are modulated signals using the encoded code word for the K bits of data;
   b. determining N signs of the received N signal values; wherein the N signs are determined in a sequence received;
   c. using the pattern of the signs in the sequence, determining a quadrant of an N dimensional space determined by the pattern of signs;
   d. de-mapping the determined quadrant to N bits of data based on the mapping used to encode N bits to a point in one quadrant of N dimensional space for determining first N bits of K bits of data;
   e. modifying the values of the signals such that a point in N dimensional space defined by coordinates having the value with their respective signs is transposed to a quadrant of the N dimensional space having all N coordinates being positive, f. comparing the modified amplitudes with predefined threshold values to determine a sub-quadrant of N dimensional space within the quadrant of N dimensional space with all N coordinates being positive;

g. de-mapping the determined quadrant to N bits of data based on the mapping used to encode N bits to a point in one quadrant of N dimensional space; and h. repeating the steps e, f, and g in sequence, ((K/N)−1) times to retrieve all the K bits.

20. An apparatus for retrieving K bits of data from the encoded code word transmitted according to claim 17, wherein the apparatus comprises a receiver configured for:

a. receiving the N signal values; wherein the received N signal values are modulated signals using the encoded code word for the K bits of data;

b. determining N signs of the received N signal values; wherein the N signs are determined in a sequence received;

c. using the pattern of the signs in the sequence, determining a quadrant of an N dimensional space determined by the pattern of signs;

d. de-mapping the determined quadrant to N bits of data based on the mapping used to encode N bits to a point in one quadrant of N dimensional space for determining first N bits of K bits of data;

e. based on the signal values along with their signs, calculating new threshold values;

f. comparing the signal values with the new threshold values to determine a sub-quadrant of N dimensional space within the previous quadrant to which the point belongs;

g. de-mapping the determined quadrant to N bits of data based on the mapping used to encode N bits to a point in one quadrant of N dimensional space; and h. repeating the steps e, f, and g in sequence (K/N−1) times for retrieving all the K bits.

* * * * *